US011516389B2

(12) United States Patent
Wu

(10) Patent No.: US 11,516,389 B2
(45) Date of Patent: Nov. 29, 2022

(54) IMAGE SENSING DEVICE, METHOD AND DEVICE, ELECTRONIC APPARATUS AND MEDIUM

(71) Applicant: BEIJING XIAOMI MOBILE SOFTWARE CO., LTD., Beijing (CN)

(72) Inventor: Jun Wu, Beijing (CN)

(73) Assignee: Beijing Xiaomi Mobile Software Co., Ltd., Beijing (CN)

(*) Notice: Subject to any disclaimer, the term of this patent is extended or adjusted under 35 U.S.C. 154(b) by 0 days.

(21) Appl. No.: 16/845,956

(22) Filed: Apr. 10, 2020

(65) Prior Publication Data
US 2021/0136282 A1 May 6, 2021

(30) Foreign Application Priority Data
Nov. 5, 2019 (CN) .......................... 201911073117.1

(51) Int. Cl.
*H04N 5/232* (2006.01)
*H01L 27/146* (2006.01)
*H04N 5/374* (2011.01)

(52) U.S. Cl.
CPC ... *H04N 5/23229* (2013.01); *H01L 27/14601* (2013.01); *H04N 5/374* (2013.01)

(58) Field of Classification Search
CPC .... H04N 5/23229; H04N 5/374; H04N 5/332; H04N 5/2256; H04N 9/04563; H01L 27/14601
See application file for complete search history.

(56) References Cited

U.S. PATENT DOCUMENTS 6,731,397 B1 5/2004 Merrill et al.
7,582,943 B2* 9/2009 Fukunaga ......... H01L 27/14634
257/432
(Continued)

FOREIGN PATENT DOCUMENTS

CN 1298483 A 6/2001
CN 1684266 A 10/2005
(Continued)

OTHER PUBLICATIONS

Kang, Manil, et al. "Optical properties of sputtered indium-tin-oxide thin films." Journal of the Korean Physical Society 59.5 (2011): 3280-3283. (Year: 2011).*
(Continued)

*Primary Examiner* — Timothy J Henn
(74) *Attorney, Agent, or Firm* — Arch & Lake LLP

(57) ABSTRACT

An image sensing device, method, an electronic apparatus, and a medium are provided. The image sensing device includes an image acquisition circuit comprising a plurality of image acquisition layer arrays, where at least one of the plurality of image acquisition layer arrays includes a reference layer, a first acquisition layer, and a second acquisition layer. The first acquisition layer is located under the reference layer and is configured to interact with the reference layer, to which a first electric signal is applied, to generate a first image signal. The second acquisition layer is located under the first acquisition layer and is configured to interact with the first acquisition layer to generate a second image signal. An image processing circuit is connected with the image acquisition circuit and configured to generate a target image according to the first image signal and the second image signal.

10 Claims, 11 Drawing Sheets

(56) References Cited

U.S. PATENT DOCUMENTS

| | | | |
|---|---|---|---|
| 10,056,423 B1* | 8/2018 | Huang | H01L 27/14647 |
| 2002/0171881 A1 | 11/2002 | Merrill et al. | |
| 2006/0171704 A1* | 8/2006 | Bingle | B60R 11/04 |
| | | | 396/419 |
| 2007/0194400 A1* | 8/2007 | Yokoyama | H01L 27/14647 |
| | | | 257/443 |
| 2008/0157254 A1* | 7/2008 | Kang | H01L 27/14647 |
| | | | 257/440 |
| 2010/0203666 A1 | 8/2010 | Endo | |
| 2011/0109762 A1* | 5/2011 | Park | H01L 27/14609 |
| | | | 348/222.1 |
| 2012/0153422 A1* | 6/2012 | Coulon | H04N 5/378 |
| | | | 257/435 |
| 2016/0295116 A1 | 10/2016 | Chieh | |
| 2019/0319061 A1* | 10/2019 | Liu | H04N 5/3559 |
| 2020/0058718 A1 | 2/2020 | Wang et al. | |

FOREIGN PATENT DOCUMENTS

| | | |
|---|---|---|
| CN | 1723564 A | 1/2006 |
| CN | 102099916 A | 6/2011 |
| CN | 102365742 A | 2/2012 |
| CN | 103022065 A | 4/2013 |
| CN | 103999458 A | 8/2014 |
| CN | 106847840 A | 6/2017 |
| CN | 107180841 A | 9/2017 |
| CN | 108074946 A | 5/2018 |
| CN | 108700824 A | 10/2018 |
| CN | 109065594 A | 12/2018 |
| CN | 110312088 A | 10/2019 |
| JP | 2001015728 A | 1/2001 |
| WO | 0072604 A1 | 11/2000 |
| WO | 2005078801 A1 | 8/2005 |
| WO | 2019174146 A1 | 9/2019 |

OTHER PUBLICATIONS

Extended European Search Report in the European Application No. 20171829.3, dated Oct. 16, 2020 (9p).

Lyu, Jeong-Ho, et al., "IR/Color Composite Image Sensor with VIPS (Vertically Integrated Photodiode Structure)", Miru Data System Co., Ltd., Jun. 7, 2007, XP055737454, (4p).

Langfelder, G., et al., "A device and an algorithm for the separation of visible and near infrared signals in a monolithic silicon sensor", SPIE-IS&T, vol. 7882 788207-2, No. 1, Jan. 23, 2011, XP060004455, (9p).

First Office Action of the Chinese application No. 201911073117.1, dated Dec. 23, 2021, (16 pages).

* cited by examiner

IMAGE SENSING DEVICE, METHOD AND DEVICE, ELECTRONIC APPARATUS AND MEDIUM

CROSS-REFERENCE TO RELATED APPLICATION

This application is based upon and claims priority to Chinese Patent Application 201911073117.1, filed on Nov. 5, 2019, the entirety of which is incorporated herein by reference.

TECHNICAL FIELD

The disclosure relates to the field of image sensing, and in particular to an image sensing device, method and device, an electronic apparatus and a medium.

BACKGROUND

Electronic apparatuses like mobile phones usually have a photography function. A user can take pictures with a camera provided on the mobile phone.

With development of electronic apparatus technologies, people have higher requirements on the screen-to-body ratio of electronic apparatuses. Therefore, to pursue for full screens, an image acquisition layer array, such as a camera, has to be arranged under the display screen. However, pictures taken with an under-screen camera have a relatively poor quality and a relatively low resolution, and thus cannot meet users' requirements.

SUMMARY

An image sensing device, method and device, an electronic apparatus and a medium are provided in the disclosure.

According to a first aspect of the disclosure, provided is an image sensing device, including an image acquisition circuit comprising a plurality of image acquisition layer arrays. At least one of the plurality of image acquisition layer arrays comprises a reference layer, a first acquisition layer, and a second acquisition layer arranged successively. The first acquisition layer is located under the reference layer and is configured to, when detecting a first light signal in a first wavelength range, interact with the reference layer, to which a first electric signal is applied, to generate a first image signal. The second acquisition layer is located under the first acquisition layer and is configured to, when detecting a second light signal in a second wavelength range, interact with the first acquisition layer to generate a second image signal, wherein the second wavelength range is not overlapped with the first wavelength range. The sensing device can include an image processing circuit, connected with the image acquisition circuit and configured to generate a target image according to the first image signal and the second image signal.

According to a second aspect of the disclosure, provided is an electronic apparatus, including a display device and the image sensing device according to the first aspect of embodiments of the disclosure. The display device comprises a first display area which allows a light ray to pass through, and the image sensing device is located under the first display area, and is configured to receive the first light signal and the second light signal through the first display area and form the target image according to the first light signal and the second light signal.

According to a third aspect of the disclosure, provided is an image sensing method, the image sensing method including enabling the first acquisition layer to, under the action of the first light signal in the first wavelength range, interact with the reference layer, to which the first electric signal is applied, to generate the first image signal. The method may include enabling the second acquisition layer to, under the action of the second light signal in the second wavelength range, interact with the first acquisition layer to generate the second image signal. The second wavelength range is not overlapped with the first wavelength range. The method include forming the target image according to the first image signal and the second image signal.

According to a fourth aspect of the disclosure, provided is an image sensing device, including: one or more processors, and a memory stored with processor-executable instructions, wherein the one or more processors are configured to execute the executable instructions to implement the acts including enable a first acquisition layer to, when detecting a first light signal in a first wavelength range, interact with a reference layer, to which a first electric signal is applied, to generate a first image signal. The one or more processors perform acts that may include enable a second acquisition layer to, when detecting a second light signal in a second wavelength range, interact with the first acquisition layer to generate a second image signal. The second wavelength range may not overlap with the first wavelength range. The one or more processors perform acts that may include generate a target image according to the first image signal and the second image signal.

According to a fifth aspect of the disclosure, provided is a non-transitory computer-readable storage medium, wherein instructions in the storage medium, when executed by one or more processors of a computing device, enable the electronic apparatus to perform the acts including enabling, on an image sensing device a first acquisition layer to, when detecting a first light signal in a first wavelength range, interact with a reference layer, to which a first electric signal is applied, to generate a first image signal. The image sensing device includes an image processing circuit, connected with an image acquisition circuit and configured to generate a target image according to the first image signal and a second image signal. The image acquisition circuit includes a plurality of image acquisition layer arrays. At least one of the plurality of image acquisition layer arrays includes a reference layer, a first acquisition layer, and a second acquisition layer arranged successively. The first acquisition layer is located under the reference layer and is configured to, when detecting a first light signal in a first wavelength range, interact with the reference layer, to which a first electric signal is applied, to generate a first image signal. The second acquisition layer is located under the first acquisition layer and is configured to, when detecting a second light signal in a second wavelength range, interact with the first acquisition layer to generate the second image signal. The second wavelength range is not overlapped with the first wavelength range. The one or more processors perform acts that may include enabling the second acquisition layer to, when detecting the second light signal in the second wavelength range, interact with the first acquisition layer to generate the second image signal. The second wavelength range is not overlapped with the first wavelength range. The one or more processors perform acts that may include generating the target image according to the first image signal and the second image signal.

It should be understood that the general description above and detailed description later are merely examples and explanatory, and are not intended to restrict the disclosure.

BRIEF DESCRIPTION OF THE DRAWINGS

The accompanying drawings herein are incorporated into the specification and constitute part of the present specification, illustrate embodiments consistent with the disclosure and are intended for explaining the principles of the disclosure together with the specification.

DETAILED DESCRIPTION

Detailed description will be made here to embodiments, examples of which are illustrated in the accompanying drawings. When drawings are referred to in the following description, identical numerals in different drawings refer to identical or similar elements, unless otherwise indicated. Implementations described in the following embodiments do not mean all the implementations consistent with the disclosure. On the contrary, they are merely examples of apparatuses and methods consistent with some aspects of the disclosure detailed in the appended claims.

The terminology used in the present disclosure is for the purpose of describing particular embodiments only and is not intended to limit the present disclosure. As used in the present disclosure and the appended claims, the singular forms "a," "an," and "the" are intended to include the plural forms as well, unless the context clearly indicates otherwise. It shall also be understood that the term "and/or" used herein is intended to signify and include any or all possible combinations of one or more of the associated listed items.

It shall be understood that, although the terms "first," "second," "third," etc. may be used herein to describe various information, the information should not be limited by these terms. These terms are only used to distinguish one category of information from another. For example, without departing from the scope of the present disclosure, first information may be termed as second information; and similarly, second information may also be termed as first information. As used herein, the term "if" may be understood to mean "when" or "upon" or "in response to a judgment" depending on the context. It shall be understood that a component being described as "under," refers to when the device the component is located in is in an upward position. The upward position, for example, may be the front of a mobile terminal facing upward.

Figure 1:
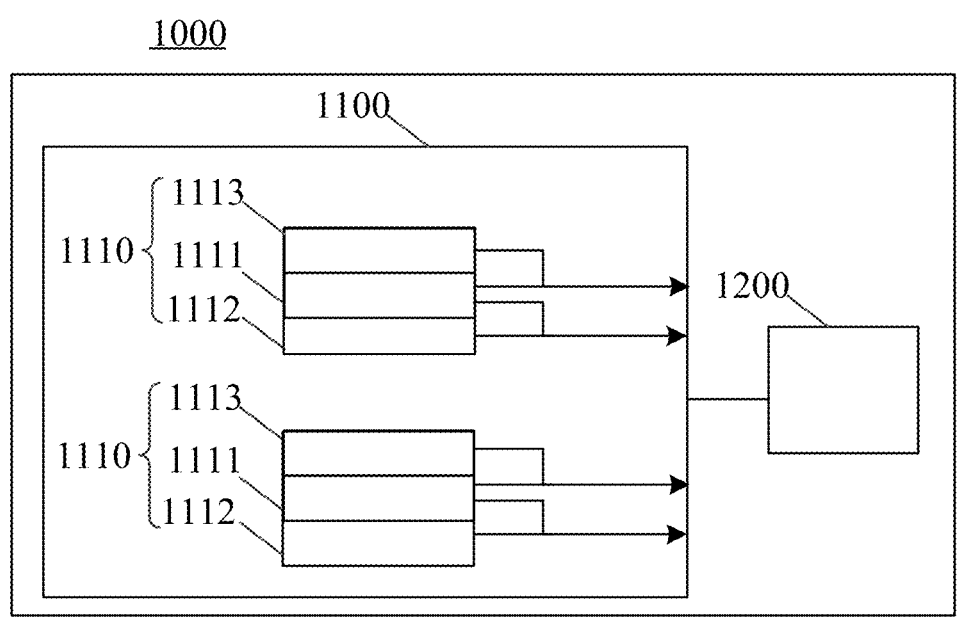
FIG. 1 illustrates a schematic diagram of an image sensing device, according to an example of the present disclosure.

FIG. 1 illustrates a schematic diagram of an image sensing device 1000 according to an embodiment. As illustrated in FIG. 1, the image sensing device 1000 includes an image acquisition circuit 1100 and an image processing circuit 1200.

The image acquisition circuit 1100 includes a plurality of image acquisition layer arrays 1110.

Each of the image acquisition layer arrays 1110 includes a reference layer 1113, a first acquisition layer 1111 and a second acquisition layer 1112 which are stacked or arranged successively.

The first acquisition layer 1111 is located under the reference layer 1113 and is configured to, under action of or when detecting a first light signal in a first wavelength range, interact with the reference layer 1113, to which a first electric signal is applied, to generate a first image signal.

The second acquisition layer 1112 is located under the first acquisition layer 1111 and is configured to, under action of or when detecting a second light signal in a second wavelength range, interact with the first acquisition layer 1111 to generate a second image signal. The second wavelength range is not overlapped with the first wavelength range.

The image processing circuit 1200 is connected with the image acquisition circuit 1100 and is configured to form a target image according to the first image signal and the second image signal.

In particular, the first wavelength range being not overlapped with the second wavelength range may include: the first wavelength range and the second wavelength range are different from each other.

For example, the first light signal may include a visible light signal. At this time, the second light signal may include an infrared signal.

For example, the first light signal may also include an ultraviolet light signal. At this time, the second light signal may include a visible light signal.

For example, the image sensing device 1000 does not contain any light filter for filtering out the second light signal.

In particular, when the first light signal is a visible light signal and the second light signal is an infrared signal, the image sensing device 1000 does not contain any infrared light filter.

When the first light signal is an ultraviolet light signal and the second light signal is a visible light signal, the image sensing device 1000 does not contain any ultraviolet light filter.

For example, when irradiating onto a same material, light signals of different wavelengths will be diffracted and project to different locations on the image acquisition layer array 1110. The light absorbing material at the different locations will absorb photons in the light signals, and generate corresponding electric signals based on the energy carried by the photons.

For example, when the first light signal and the second light signal are incident onto a same material in a direction perpendicular to a first surface of the same material, since the wavelength of the first light signal is different from that of the second light signal, the locations where the first light signal and the second light signal are absorbed respectively, in the direction of incidence of the first light signal and the second light signal, are different from each other.

In this embodiment, since the first wavelength of the first light signal is different from the second wavelength of the second light signal, when the first light signal and the second light signal irradiate onto a surface of a same image acquisition layer array 1110, the locations where the first light signal and the second light signal are absorbed respectively on the same image acquisition layer array are different from each other. Based on that the locations where the first light signal and the second light signal are absorbed respectively are different from each other, a first acquisition layer for acquiring the first light signal and a second acquisition layer for acquiring the second light signal can be provided in the same image acquisition layer array in a staked manner. In this way, the first light signal of the first wavelength and the second light signal of the second wavelength can both be acquired by the same image acquisition layer array.

For example, when light signals are incident onto the image acquisition layer array 1110 through the reference layer 1113, a distance between the first acquisition layer 1111 and an incidence surface of the light signals is smaller than a distance between the second acquisition layer 1112 and the incidence surface. Therefore, the first acquisition layer 1111 absorbs a light signal of a shorter wavelength in the incident light signals, and the second acquisition layer 1112 absorbs a light signal of a longer wavelength in the incident light signals. Here, the first wavelength is smaller than the second wavelength.

For example, when light signals are incident onto the image acquisition layer array 1110 through the second acquisition layer 1112, a distance between the first acquisition layer 1111 and an incidence surface of the light signals is greater than a distance between the second acquisition layer 1112 and the incidence surface. Therefore, the first acquisition layer 1111 absorbs a light signal of a longer wavelength in the incident light signals, and the second acquisition layer 1112 absorbs a light signal of a shorter wavelength in the incident light signals. Here, the first wavelength is greater than the second wavelength.

Compared with a typical image acquisition layer array which can merely form an image based on a light signal of a single wavelength, the image acquisition layer array according to the embodiments of the disclosure can not only absorb a first light signal of a first wavelength to generate a first image signal, but also absorb a second light signal of a second wavelength to generate a second image signal, and form a target image based on the two light signals. Accordingly, loss of image features due to formation of an image based on a single light signal is reduced, and the quality of the target image is increased.

In some embodiments, the first wavelength range includes a range of 380 nm to 700 nm, and the second wavelength range includes a range of 760 nm to 1 μm.

Figure 2:
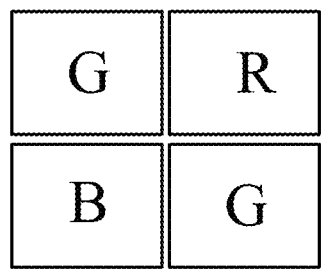
FIG. 2 illustrates a schematic diagram of an arrangement of a plurality of image acquisition layer arrays, according to an example of the present disclosure.
Figure 3:
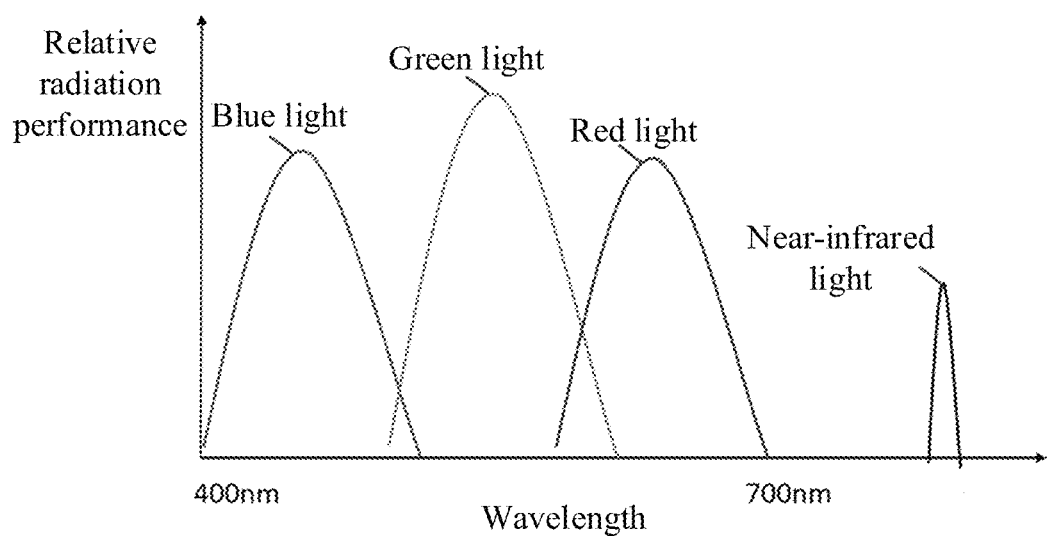
FIG. 3 illustrates a graph of spectral distribution, according to an example of the present disclosure.

In practical application, objects in an environment generate infrared signals due to thermal radiation or the like. In the related art, an image sensing device is generally only used for acquiring visible light signals, and a visible light filter for filtering out light of specific wavelengths is provided on each photosensitive unit, to form an acquisition array as illustrated in FIG. 2 to acquire visible light. A first unit is configured to acquire red light (R), a second unit is configured to acquire green light (G), and a third unit is configured to acquire blue light (B). FIG. 3 illustrates spectral distribution of the visible light that can pass through the corresponding filters. As such, when the brightness in the environment is low at present, the light amount of visible light signals that can be acquired is small, the generated image is dark and has much image noise. The resolution of the image sensing device is worse.

Furthermore, a near-infrared signal with a wavelength in a near-infrared wavelength range may affect the image sensor's acquisition of the visible light signal, and generate noise thereto, an infrared light filter is generally provided in the related art to reduce the infrared signal acquired by the image sensor. However, the effect of color reproduction is poor.

In embodiments of the disclosure, by providing a reference layer 1113, a first acquisition layer 1111 and a second acquisition layer 1112 in an image acquisition layer array in a stacked manner, when a visible light signal and an infrared signal are incident onto the image acquisition layer array 1110 through the reference layer 1113, the image acquisition layer array 1110 absorbs the visible light signal through the first acquisition layer 1111 and absorbs the infrared signal through the second acquisition layer 1112. The wavelength range of the light signals that can be acquired by each image acquisition layer array can be expanded.

Therefore, compared with a typical image acquisition layer array forming a target image merely under action of or when detecting a visible light signal, each image acquisition layer array according to the embodiments of the disclosure can absorb the visible light signal and the infrared signal, which can expand the wavelength range of the light signals that can be absorbed by the image acquisition layer array and improve the effect of image acquisition.

Furthermore, in the embodiments of the disclosure, the visible light signal and the infrared signal are acquired by the same image acquisition layer array, the size of a light-receiving face of the image acquisition circuit is reduced compared with a typical way of providing different image acquisition layer arrays in parallel to acquire the visible light signal and the infrared signal respectively.

Moreover, in the embodiments of the disclosure, there is no need to provide an infrared light filter. Instead, the first image signal generated under the action of the visible light signal and the second image signal generated under the action of the infrared signal by each image acquisition layer array are fused into the target image. Therefore, the quality of the formed target image can be improved.

Figure 4:
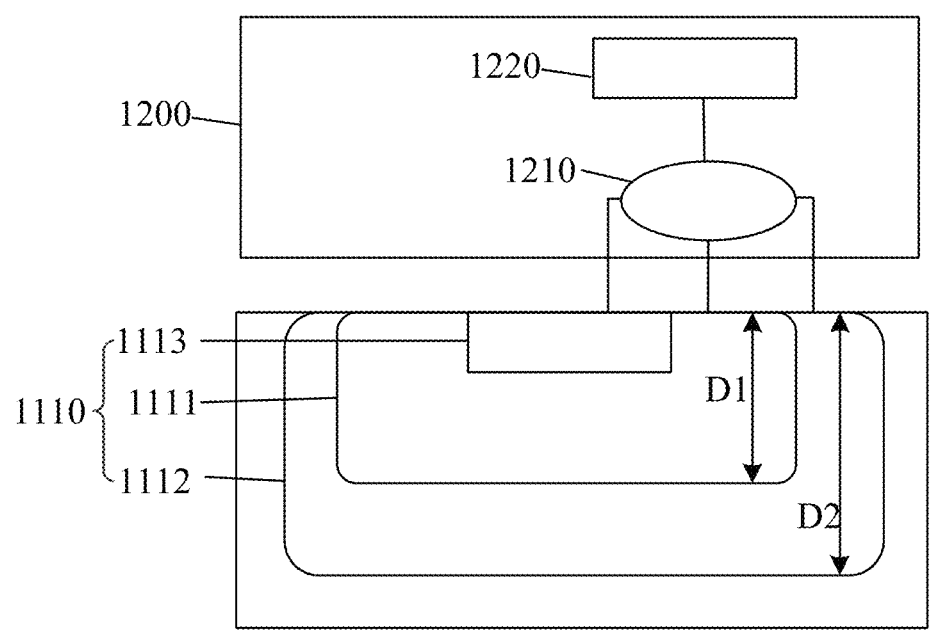
FIG. 4 illustrates a schematic diagram of an image acquisition circuit, according to an example of the present disclosure.

In some embodiments, as illustrated in FIG. 4, the image processing circuit 1200 includes a first processor 1210 and a second processor 1220.

The first processor 1210 is connected with the reference layer 1113 and the first acquisition layer 1111, and is configured to form a first image according to the first image signal. The first processor 1210 is further connected with the second acquisition layer 1112 and is configured to form or generate a second image according to the second image signal.

The second processor 1220 is configured to fuse the first image and the second image into the target image.

For example, the first processor 1210 may include a signal transmission circuit, a source follower, etc.

For example, when receiving the first image signal and the second image signal, the first processor 1210 may first process the first image signal to form the first image, and then process the second image signal to form the second image.

Alternatively, when receiving the first image signal and the second image signal, the first processor 1210 may firstly process the second image signal to form the second image, and then process the first image to form the first image.

It is to be understood that the first processor 1210 is also connected with the second processor 1220 so as to provide the first image and the second image to the second processor 1220.

In some embodiments, the first processor 1210 may include a first sub-unit and a second sub-unit.

The first sub-unit is connected with the reference layer and the first acquisition layer, and is configured to form the first image according to the first image signal.

The second sub-unit is connected with the first acquisition layer and the second acquisition layer, and is configured to form the second image according to the second image signal.

It is to be understood that the first sub-unit is also connected with the second processor 1220 to provide the first image to the second processor 1220, and the second sub-unit is further connected with the second processor 1220 to provide the second image to the second processor 1220.

The second processor 1220 may select the approach of image fusion according to actual requirements. For example, the second processor 1220 may implement data-level fusion and feature-level fusion.

By way of example, fusion may be performed by a weighted average algorithm. In particular, when the image acquisition circuit includes an array of N*N image acquisition layer arrays, the second processor 1220 may calculate a weighted average of: a first pixel value of the first image formed by a first light signal absorbed by the image acquisition layer array at the $M^{th}$ row and the $K^{th}$ column, and a second pixel value of the second image formed by a second light signal absorbed by the image acquisition layer array at the $M^{th}$ row and the $K^{th}$ column, to get a pixel value of a pixel at the $M^{th}$ row and the $K^{th}$ column of the target image, where N, M, and K are all positive integers, M is smaller than or equal to N, and K is smaller than or equal to N.

In the embodiments of the disclosure, the first image signal and the second image signal are output respectively. The first processor 1210 forms the first image according to the first image signal, and forms the second image according to the second image signal. Then the second processor 1220 fuses the first image and the second image into the target image. The signal to noise ratio of the target image can be improved, and the resolution of the image sensing device can be promoted.

In some embodiments, a composed material of the first acquisition layer 1111 has a first band gap, and a composed material of the second acquisition layer 1112 has a second band gap. The second band gap is smaller than the first band gap.

For example, both the composed material of the first acquisition layer and the composed material of the second acquisition layer may include: a semiconductor material, an organic photoelectric material, a nanostructured material, etc., for example, silicon, and carbon nanotubes.

The first band gap denotes an energy difference between a lowest point of a conduction band and a highest point of a valence band in an energy band structure of the composed material of the first acquisition layer 1111, that is to say, a maximum value of the energy difference between the conduction band and valence band of the composed material of the first acquisition layer 1111.

The second band gap denotes an energy difference between a lowest point of a conduction band and a highest point of a valence band in an energy band structure of the composed material of the second acquisition layer 1112, that is to say, a maximum value of the energy difference between the conduction band and valence band of the composed material of the second acquisition layer 1112.

Generally, a light signal may be considered as photons with energy, the energy of the photons is negatively correlated with the wavelength of the light signal. That is, the higher the wavelength of the light signal is, the lower the energy of the corresponding photons is.

When the light signal irradiates onto a semiconductor material, the photons transfer the energy carried in itself to bound electrons in the material. When the energy transferred to the electrons by the photons is greater than the band gap of the material, the electrons having obtained the energy can transition from the valence band to the conduction band and become free electrons, and electron-hole pairs are formed in the semiconductor material, thus forming a current.

When the first wavelength of the first light signal is smaller than the second wavelength of the second light signal, the energy of the first light signal is greater than that of the second light signal. It is to be understood that the energy of the first light signal is greater than or equal to the first band gap of the first acquisition layer 1111, the energy of the second light signal is smaller than the first band gap of the first acquisition layer 1111, and the energy of the second light signal is greater than or equal to the second band gap of the second acquisition layer 1112.

Therefore, when the first light signal is incident onto the first acquisition layer 1111, the energy of the photons corresponding to the first light signal can enable the bound electrons in the first acquisition layer 1111 to perform transition. However, when the second light signal is incident onto the first acquisition layer 1111, the photons corresponding to the second light signal do not have enough energy to enable the bound electrons in the first acquisition layer 1111 to perform transition. When the second light signal is incident onto the second acquisition layer 1112, the energy of the photons corresponding to the second light signal can enable the electrons in the second acquisition layer 1112 to perform transition.

When the first light signal is incident onto the first acquisition layer 1111, the first light signal can enable the bound electrons in the first acquisition layer 1111 to perform transition, so as to generate electron-hole pairs in the first acquisition layer 1111. The potential difference between the first acquisition layer 1111 and the reference layer 1113 is changed, so that the free electrons generated in the first acquisition layer 1111 make directional movement to generate a first image signal.

When the second light signal is incident onto the second acquisition layer 1112, the second light signal can enable the bound electrons in the second acquisition layer 1112 to perform transition, so as to generate electron-hole pairs in the second acquisition layer 1112. The potential difference between the second acquisition layer 1112 and the first acquisition layer 1111 is changed, so that the free electrons generated by the second acquisition layer 1112 make directional movement to generate a second image signal.

Figure 5:
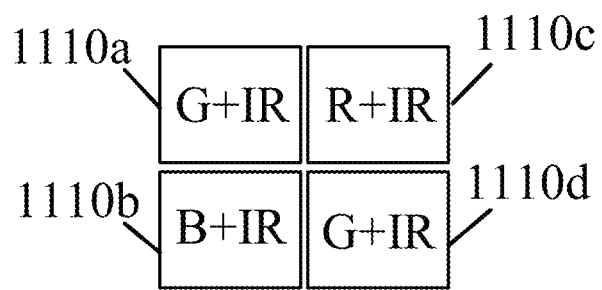
FIG. 5 illustrates a schematic diagram of another arrangement of a plurality of image acquisition layer arrays, according to an example of the present disclosure.

In the embodiments of the disclosure, four adjacent image acquisition layer arrays capable of absorbing visible light of different wavelengths can be formed with composed materials having different first band gaps, so as to form the array of image acquisition layer arrays as illustrated in FIG. 5. An image acquisition layer array 1110*a* can acquire a green visible light signal and an infrared signal. An image acquisition layer array 1110*b* can acquire a blue visible light signal and an infrared signal. An image acquisition layer array 1110*c* can acquire a red visible light signal and an infrared signal. An image acquisition layer array 1110*d* can acquire a green visible light signal and an infrared signal.

In this embodiment, by forming the first acquisition layer 1111 with a composed material having a first band gap and forming the second acquisition layer 1112 located under the first acquisition layer 1111 with a composed material having a second band gap, both the first light signal and the second light signal can be absorbed by the same image acquisition layer array. The utilization rate of the incident light signals by the image acquisition layer array is improved, and the resolution of the image acquisition layer array is improved, thereby improving the quality of the formed target image.

In some embodiments, the image sensing device further includes: an emitter configured to emit a third light signal. A wavelength of the third light signal is the same as a wavelength of the second light signal, and the third light signal acts on a target object to generate a first reflective light signal. The second acquisition layer is configured to, under action of or when detecting the first reflective light signal and the second light signal, interact with the first acquisition layer to generate the second image signal.

The wavelength of the third light signal being the same as the wavelength of the second light signal may include: a wavelength range of the third light signal being the same as the second wavelength range, or the wavelength range of the third light signal being within the second wavelength range.

For example, when the second light signal is an infrared signal, the emitter may include an infrared light source. At this time, the emitted third light signal is an infrared signal.

In practical application, the infrared signal existing in the environment is weak. In a dark environment, the light amount of a visible light signal is small, an image formed merely by the infrared signal radiated by a target object may have a lot of noise.

In the embodiments of the disclosure, by providing an infrared light source capable of emitting an infrared signal, so as to initially emit an infrared signal to the environment, the infrared signal emitted by the infrared light source acts on a target object in the environment and is reflected to generate a first reflective light signal. Therefor, the light amount of the infrared signal received by the image acquisition layer array can be increased, thereby facilitating improving the resolution of the image acquisition layer array, and improving the quality of the target image.

Figure 6A:
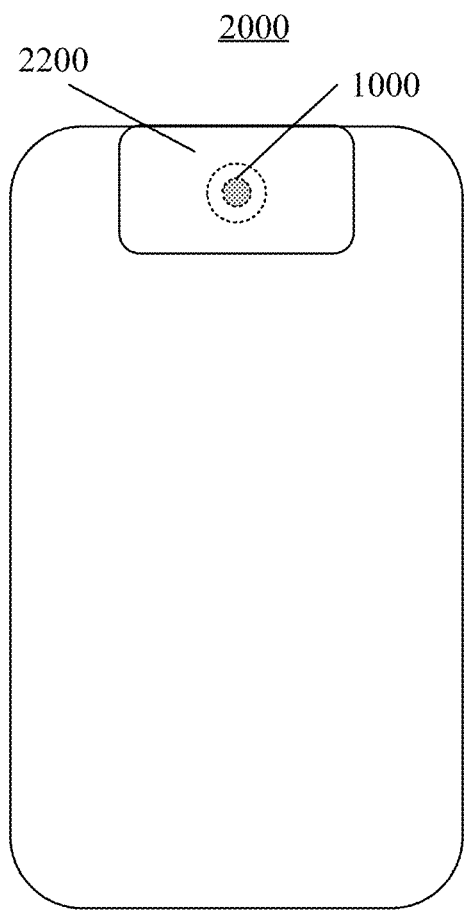
FIG. 6A illustrates a schematic diagram of an electronic apparatus, according to an example of the present disclosure.
Figure 6B:
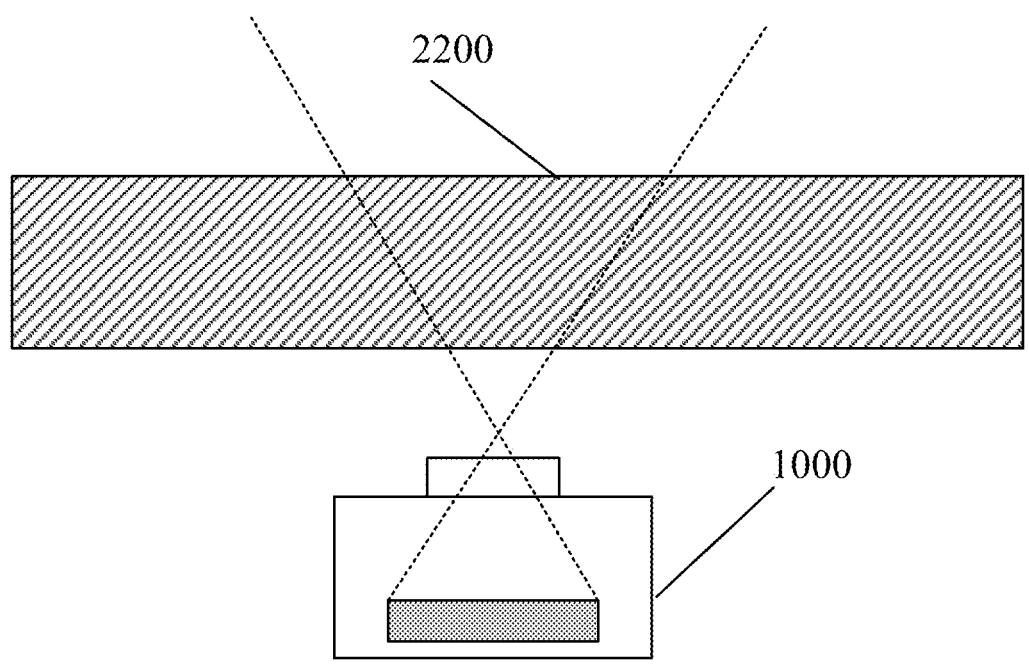
FIG. 6B illustrates a schematic diagram of part of an electronic apparatus, according to an example of the present disclosure.

FIGS. 6A and 6B illustrate schematic diagrams of an electronic apparatus 2000 according to an embodiment. As illustrated in FIGS. 6A and 6BF, the electronic apparatus 2000 includes a display device and the image sensing device 1000 provided in the embodiments of the disclosure.

The display device includes a first display area 2200 which allows a light ray to pass through.

The image sensing device 1000 is located under the first display area 2200, and is configured to receive the first light signal and the second light signal through the first display area 2200 and form the target image according to the first light signal and the second light signal.

For example, the first display area may include a plurality of pixels, and there is a gap between adjacent pixels. The light ray can pass through the first display area through the pixels or through the gap between the adjacent pixels.

It is to be understood that the first display area 2200 may include the entire display area of the electronic apparatus 2000, or a partial display area of the electronic apparatus 2000. In the embodiments of the disclosure, the image sensing device 1000 is arranged under the first display area 2200. There is no need to preserve, on a surface of the electronic apparatus where the first display area is provided, a zone for arrangement of the image sensing device, thus providing a basis for realizing the full-screen technique.

Compared with a typical image acquisition layer array which can merely form an image based on a light signal of a single wavelength, the image acquisition layer array according to the embodiments of the disclosure can not only absorb a first light signal of a first wavelength to generate a first image signal, but also absorb a second light signal of a second wavelength to generate a second image signal, and form a target image based on the two light signals. Accordingly, loss of image features due to formation of an image based on a single light signal is reduced, and the quality of the target image is increased, and thus the display effect of an electronic apparatus is improved.

In some embodiments, the first display area includes a plurality of pixels.

The image sensing device 1000 is configured to receive the first light signal and the second light signal through a gap between the pixels.

In practical application, when the light rays pass through the first display area through the pixels, loss of the light rays caused by the pixels is great, since the pixels have a function of blocking the light rays. When the light rays pass through the first display area through the gaps between the adjacent pixels, loss of the light rays caused by the gaps between the pixels is less.

With the light rays being a visible light signal as an example, when the visible light signal passes through the first display area through the pixels, the light amount of the visible light signal having passed through the pixels may be only 20% to 30% of the total light amount of the visible light signal incident onto the pixels. When the visible light signal passes through the first display area through the gaps between the pixels, the light amount of the visible light signal having passed through the gaps may be 60% to 70% of the total light amount of the visible light signal incident onto the pixels.

In the embodiments of the disclosure, the image sensing device receives the first light signal and the second light signal through the gaps between the pixels. Compared with the image sensing device receiving the first light signal and the second light signal passing through the pixels, the quality of the received first and second light signals are improved. Thus the quality of the formed target image is increased, facilitating improving the display effect of the electronic apparatus.

Figure 7:
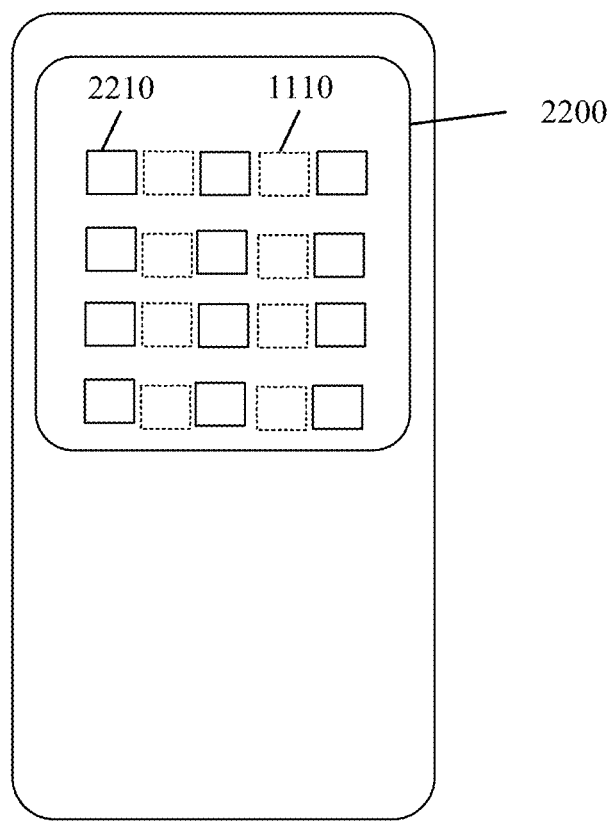
FIG. 7 illustrates a schematic diagram of another electronic apparatus, according to an example of the present disclosure.

In some embodiments, as illustrated in FIG. 7, each of the image acquisition layer arrays 1110 is located at a gap between at least two of the pixels 2210. A size of the image acquisition layer array 1110 is smaller than or equal to a size of the gap between the at least two of the pixels 2210.

For example, the image acquisition layer arrays may include a sub-pixel or a pixel. For example, the image acquisition layer array may be a sub-pixel capable of receiving a red visible light signal and an infrared signal, or a sub-pixel capable receiving a green visible light signal and an infrared signal, or a sub-pixel capable of receiving a blue visible light signal and an infrared signal.

The image acquisition layer array may also be a pixel including four sub-pixels. The pixel includes a sub-pixel capable of receiving a red visible light signal and an infrared signal, two sub-pixels each of which is capable receiving a green visible light signal and an infrared signal, and a sub-pixel capable of receiving a blue visible light signal and an infrared signal.

As illustrated in FIG. 7, by arranging the image acquisition layer array 1110 at the gap between two pixels 2210, the pixels 2210 can be prevented from blocking the incident first and second light signals. The light amounts of the first and second light signals received by the image acquisition layer array are improved, thus facilitating improving the quality of the acquired target image.

In some embodiments, the electronic apparatus further includes an emitter.

The emitter is configured to emit a fourth light signal. A wavelength of the fourth light signal is the same as a wavelength of the second light signal, and the fourth light signal acts on a target object to generate a second reflective light signal.

The second acquisition layer 1112 is configured to, under action of or when detecting both the second light signal and the second reflective light signal, interact with the first acquisition layer 1111 to generate the second image signal.

The wavelength of the fourth light signal being the same as the wavelength of the second light signal may include: a wavelength range of the fourth light signal being the same as the second wavelength range, or the wavelength range of the fourth light signal being within the second wavelength range.

In the embodiments of the disclosure, when the second light signal is an infrared signal, the emitter initiatively emits a fourth light signal having the same wavelength as that of the second light signal. The emitted fourth light signal acts on a target object in the environment, and is reflected to generate a second reflective light signal. It is to be understood that the second reflective light signal also has the same wavelength as that of the second light signal as well. As such, the light amount of the light signal having the second wavelength received by the image acquisition layer array can be improved, facilitating improving the resolution of the image acquisition layer array, thereby improving the quality of the target image.

Moreover, since the second light signal is an infrared signal, the emitted fourth light signal will not be perceived by a user's eyes, and will not cause discomfort to the user.

Example I

With technological development of electronic apparatuses, such as mobile phones, people have higher requirements on the screen-to-body ratio. A front camera designed for a self-photographing function is one of the important factors affecting the full-screen technique of a mobile phone and the front morphology of the mobile phone. At present, in the related art, a mechanically movable front camera is provided, or a hole is opened in a display screen to accommodate a front camera, or a water-drop-shaped or fringe-shaped area is formed on a front panel of the mobile terminal to accommodate the front camera.

When the camera is disposed under a cover plate glass of the mobile phone, the light transmittance of the cover plate glass is 80% to 90% only. When the camera is disposed under the display screen, since the display screen can block visible light, the light transmittance of the display screen for the visible light is generally 20% to 30% only, and thus the amount of light received by the camera under the display screen is significantly reduced, and the acquired image tends to be dark. Especially when the ambient luminance is low, the resolution of an image acquired by an under-screen camera becomes worse, and users' requirements cannot be satisfied.

In the related art, on one aspect, the display density of the display area above the camera may be decreased, to reduce the amount of display pixels above the camera and to increase the amount of visible light that can be received by the under-screen camera, which, however, influences the display effect in the display area.

On the other aspect, the area of a photosensitive unit in an image sensor may be increased to compensate for a poor image acquisition effect caused by a low light transmittance. However, the improvement of the resolution is limited, and the users' requirements cannot be satisfied.

For example, as illustrated in FIG. 4, the reference layer 1113 may be a first P-type doped silicon layer having a first doping density. The first acquisition layer 1111 may be an N-type doped silicon layer having a second doping density. The second acquisition layer may be a second P-type doped silicon layer with a third doping density. Here, the first and second P-type doped silicon layers are silicon layers in which the density of hole carriers is greater than that of electron carriers due to doping. The N-type doped silicon layer is a silicon layer in which the density of electron carriers is greater than that of hole carriers due to doping.

A distance between a lower surface of the first acquisition layer 1111 and an upper surface of the reference layer 1113 is D1, and a distance between a lower surface of the second acquisition layer 1112 and the upper surface of the reference layer is D2. For example, when the first light signal is a visible light signal and the second light signal is an infrared signal, D1 may be 3 μm, and D2 may be 5 μm.

Figure 8:
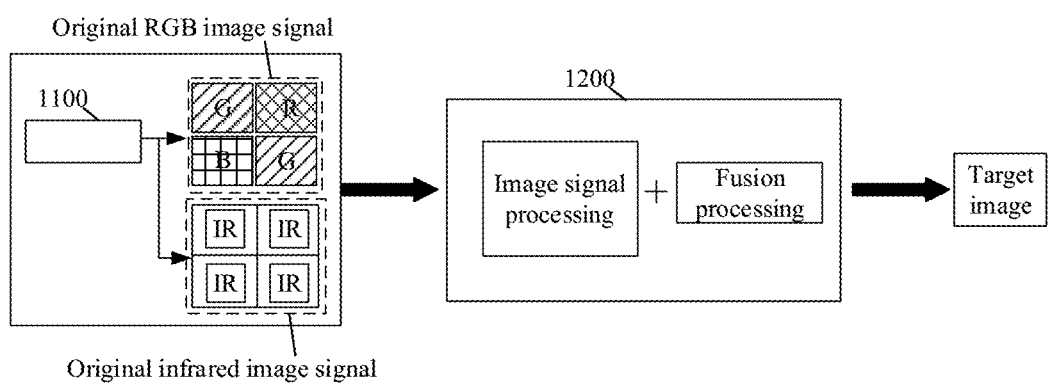
FIG. 8 illustrates a schematic diagram of an image sensing method, according to an example of the present disclosure.

For example, taking the four image acquisition layer arrays arranged as illustrated in FIG. 5 as an example, in conjunction with FIG. 8, the first image signal formed by each of the image acquisition layer arrays 1110a, 1110b, 1110c and 1110d may correspond to an original RGB image signal. The second image signal formed by each of the image acquisition layer arrays 1110a, 1110b, 1110c and 1110d may correspond to an original infrared (IR) image signal. The original RGB image signal and the original IR image signal are output to the image processing circuit 1200 respectively. The image processing circuit 1200 processes the original RGB image signal and the original infrared image signal as two frames of images separately, and then fuse the obtained RGB image and IR image into the target image. As such, the signal to noise ratio of the target image can be increased, and the resolution of the image sensing device can be increased.

Figure 9:
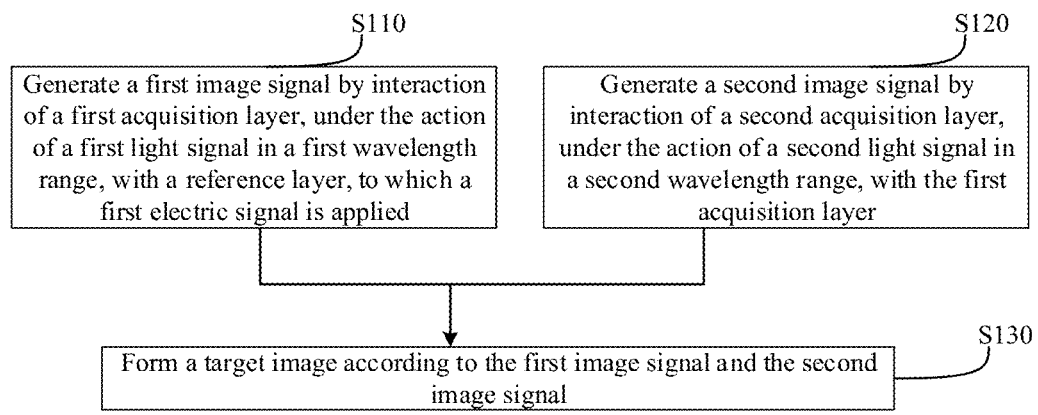
FIG. 9 illustrates a flowchart of an image sensing method, according to an example of the present disclosure.

FIG. 9 illustrates a flowchart of an image sensing method according to an embodiment. The method is applied to the image sensing device 100 provided in the embodiments of the disclosure. As illustrated in FIG. 9, the method includes the following steps.

At step S110, a first image signal is generated by interaction of the first acquisition layer, under action of or when detecting a first light signal in a first wavelength range, with the reference layer, to which the first electric signal is applied.

At step S120, a second image signal is generated by interaction of the second acquisition layer, under action of or when detecting a second light signal in a second wavelength range, with the first acquisition layer. The second wavelength range is not overlapped with the first wavelength range.

At step S130, the target image is formed according to the first image signal and the second image signal.

Compared with a typical image acquisition layer array which can merely form an image based on a light signal of a single wavelength, the image acquisition layer array according to the embodiments of the disclosure can not only absorb a first light signal of a first wavelength to generate a first image signal, but also absorb a second light signal of a second wavelength to generate a second image signal, and form a target image based on the two light signals. Accordingly, loss of image features due to formation of an image based on a single light signal is reduced, and the quality of the target image is increased.

In some embodiments, the method further includes: emitting a fifth light signal towards exterior of a housing of the image sensing device. A wavelength of the fifth light signal is the same as a wavelength of the second light signal, and the fifth light signal acts on a target object to generate a third reflective light signal.

The step S120 may include the operation that the second acquisition layer, under action of or when detecting the second light signal and the third reflective light signal, interacts with the first acquisition layer to generate the second image signal.

The wavelength of the fifth light signal being the same as the wavelength of the second light signal may include: a wavelength range of the fifth light signal being the same as the second wavelength range, or the wavelength range of the fifth light signal being within the second wavelength range.

In the embodiments of the disclosure, when the second light signal is an infrared ray signal, the fifth light signal having the same wavelength as that of the second light signal is emitted initiatively to the environment. The emitted fifth light signal acts on a target object in the environment, and is reflected to generate a third reflective light signal. It is to be understood that the third reflective light signal also has the same wavelength as that of the second light signal as well. As such, the light amount of the light signal having the second wavelength received by the image acquisition layer array can be improved, facilitating improving the resolution of the image acquisition layer array and thereby improving the quality of the target image.

Moreover, since the second light signal is an infrared signal, the emitted fifth light signal will not be perceived by a user's eyes, and will not cause discomfort to the user.

Figure 10:
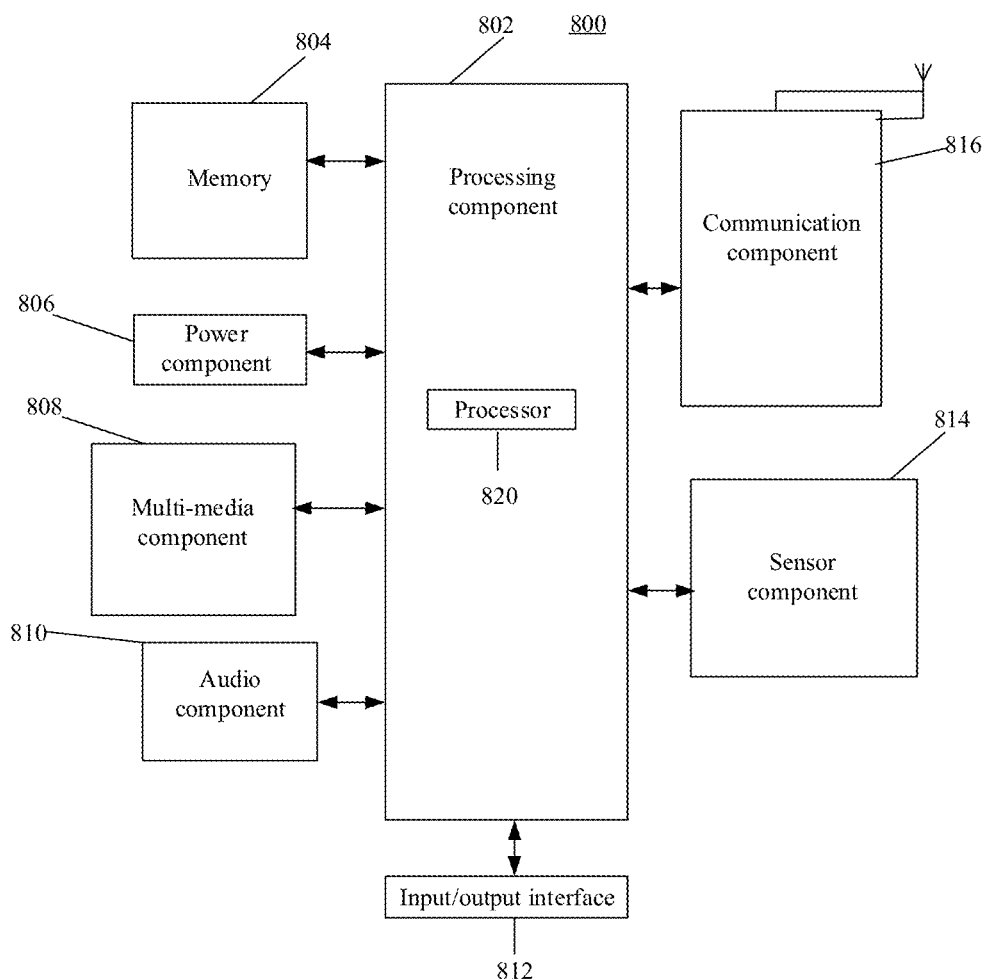
FIG. 10 illustrates a block diagram of an image sensing device, according to an example of the present disclosure.

FIG. 10 illustrates a block diagram of an image sensing device 800 according to an embodiment. For example, the device 800 may be a mobile phone, a computer, a digital broadcast terminal, a message transcribing device, a game console, a tablet device, medical equipment, fitness equipment, a personal digital assistant, etc.

As illustrated in FIG. 10, the device 800 may include one or more of: a processing component 802, a memory 804, a power component 806, a multi-media component 808, an audio component 810, an input/output (I/O) interface 812, a sensor component 814 and a communication component 816.

The processing component 802 generally controls the overall operation of the device 800, such as operations associated with display, a phone call, data communication, a camera operation and a recording operation. The processing component 802 may include one or more processors 820 to execute instructions, so as to complete all or some steps in the methods above. In addition, the processing component 602 may include one or more modules for the interaction between the processing component 802 and the other components. For example, the processing component 802 may include a multi-media module for interaction between the multi-media component 808 and the processing component 802.

The memory 804 is configured to store various types of data so as to support operations at the device 800. The examples of these types of data include instructions of any application or method for operating on the device 800, contact person data, phone book data, messages, pictures, video, etc. The memory 804 may be implemented by any type of volatile or non-volatile storage device or a combination of both, for example, a static random access memory (SRAM), an electrically erasable programmable read-only memory (EEPROM), an erasable programmable read-only memory (EPROM), a programmable read-only memory (PROM), a read-only memory (ROM), a magnetic memory, a flash memory, a magnetic disk or an optical disk.

The power component 806 supplies power for the various components of the device 800. The power component 806 may include a power management system, one or more power sources, and other components associated with the generation, management and distribution of power for the device 800.

The multi-media component 808 includes a screen serving as an output interface between the device 800 and a user. In some embodiments, the screen may include a liquid crystal display (LCD) and a touch pad (TP). If the screen includes a touch pad, then the screen may be implemented as a touch screen so as to receive an input signal from the user. The touch pad includes one or more touch sensors to sense touch, slide and gestures on the touch pad. The touch sensors may not only sense the boundary of a touch or slide action, but also can detect the duration and pressure related to the touch or slide operation. In some embodiments, the multi-media component 808 includes a front camera and/or a rear camera. When the device 800 is in an operating mode, such as a photography mode or a video mode, the front camera and/or the rear camera may receive external multi-media data. Each front camera and/or rear camera may be a fixed optical lens system or have a focal length or optical zoom capability.

The audio component 810 is configured to output and/or input an audio signal. For example, the audio component 810 includes a microphone (MIC), and when the device 800 is in an operating mode, such as a calling mode, a recording mode and a voice recognition mode, the microphone is configured to receive an external audio signal. The received audio signal can be further stored in the memory 804 or sent via the communication component 816. In some embodiments, the audio component 810 further includes a loudspeaker for outputting an audio signal.

The I/O interface 812 provides an interface between the processing component 802 and a peripheral interface module, and the above peripheral interface module may be a keyboard, a click wheel, a button, etc. The button may include but is not limited to a home page button, a volume button, a start button and a locking button.

The sensor component 814 includes one or more sensors for providing state evaluation for the device 800 from various aspects. For example, the sensor component 814 may detect an on/off state of the device 800, and the relative positioning between components; for example the components are a display and keyboard of the device 800. The sensor component 814 may also detect a positional change of the device 800 or a component of the device 800, whether there is contact between a user and the battery charging apparatus 800, the orientation or acceleration/deceleration of the device 800, and a temperature change of the device 800. The sensor component 814 may include a proximity sensor configured to detect the existence of an object nearby without any physical contact. The sensor component 814 may also include an optical sensor, such as a CMOS or CCD image sensor, for use in an imaging application. In some embodiments, the sensor component 814 may also include an acceleration sensor, a gyroscope sensor, a magnetic sensor, a pressure sensor or a temperature sensor.

The communication component 816 is configured for wired or wireless communication between the device 800 and another device. The device 800 may access a communication standard based wireless network, such as WiFi, 2G, 5G or a combination thereof. In an embodiment, the communication component 816 receives a broadcast signal from an external broadcast management system or broadcasts relevant information through a broadcast channel. In an embodiment, the communication component 816 further includes a near-field communication (NFC) module for short-range communication. For example, the NFC module may be implemented based on the radio-frequency identification (RFID) technique, the infrared data association (IrDA) technique, the ultra-wide band (UWB) technique, the bluetooth (BT) technique or others.

In an embodiment, the device 800 may be implemented by one or more application-specific integrated circuit (ASIC), a digital signal processor (DSP), a digital signal processing device (DSPD), a programmable logic device (PLD), a field programmable gate array (FPGA), a controller, a micro-controller, a micro-processor or other electronic elements, for executing the above methods.

In an embodiment, a non-transitory computer-readable storage medium including instructions is also provided, for example a memory 804 including instructions. The above instructions may be executed by the processor 820 of the device 800 to complete the above methods. For example, the non-transitory computer-readable storage medium may be a ROM, a random-access memory (RAM), a CD-ROM, a magnetic tape, a floppy disk, an optical data storage device and so on.

Provided is a non-transitory computer-readable storage medium, wherein instructions in the storage medium, when executed by a processor of an electronic apparatus, enable the electronic apparatus to perform the image sensing method according to the embodiments of the disclosure.

Compared with a typical image acquisition layer array which can merely form an image based on a light signal of a single wavelength, the image acquisition layer array according to the embodiments of the disclosure can not only absorb a first light signal of a first wavelength to generate a first image signal, but also absorb a second light signal of a second wavelength to generate a second image signal, and form a target image based on the two light signals. Accordingly, loss of image features due to formation of an image based on a single light signal is reduced, and the quality of the target image is increased.

Other embodiments of the disclosure would readily occur to those skilled in the art when considering the specification and practicing the disclosure here. The disclosure is aimed at covering any variants, usages or adaptive changes that comply with generic principles of the disclosure and include common knowledge or customary technical means in the art that is not disclosed in the disclosure. The specification and embodiments are merely considered an example, and the true scope and spirit of the disclosure are specified by the appended claims.

It should be understood that the disclosure is not limited to the precise structures described above and illustrated in the accompanying drawings, and modifications and changes may be made thereto without departing from the scope thereof. The scope of the disclosure is merely defined by the appended claims.

What is claimed is:

1. An image sensing device, comprising:
an image acquisition circuit comprising a plurality of image acquisition layer arrays,
wherein at least one of the plurality of image acquisition layer arrays comprises a reference layer, a first acquisition layer, and a second acquisition layer arranged successively,
wherein the first acquisition layer is located under the reference layer, and the image sensing device is located under a first display area of a display device, the first acquisition layer is configured to, when detecting a first light signal in a first wavelength range through the first display area, interact with the reference layer, to which a first electric signal is applied, to generate a first image signal, and
wherein the second acquisition layer is located under the first acquisition layer, and the image sensing device is located under the first display area of the display device, the second acquisition layer is configured to, when detecting a second light signal in a second wavelength range through the first display area, interact with the first acquisition layer to generate a second image signal, wherein the second wavelength range is not overlapped with the first wavelength range, wherein the second light signal is an ambient infrared light signal;
an image processing circuit, connected with the image acquisition circuit and configured to generate a target image according to the first image signal and the second image signal, and
an emitter, configured to emit a third light signal, wherein a wavelength of the third light signal is equal to a wavelength of the second light signal, and the third light signal acts on a target object to generate a first reflective light signal, and wherein the second acquisition layer is configured to, when detecting the first reflective light signal and the second light signal, interact with the first acquisition layer to generate the second image signal,
wherein the first wavelength range comprises a range of 380 nm to 700 nm, and wherein the second wavelength range comprises a range of 760 nm to 1 μm;
wherein the first display area comprises a plurality of pixels, and wherein the at least one of the plurality of image acquisition layer arrays is located at a gap between at least two of the plurality of pixels, wherein a size of the at least one of the plurality of image acquisition layer arrays is smaller than or equal to a size of the gap between the at least two of the plurality of pixels, to enable the first light signal and the second light signal to pass through the gap between the at least two of the plurality of pixels and to be detected by the first acquisition layer and a second acquisition layer.

2. The image sensing device according to claim 1, wherein the image processing circuit comprises:
a first processor, connected with the reference layer and the first acquisition layer, and configured to generate a first image according to the first image signal, and the first processor being further connected with the second acquisition layer, and configured to generate a second image according to the second image signal, and
a second processor, configured to fuse the first image and the second image into the target image.

3. The image sensing device according to claim 1, wherein a composed material of the first acquisition layer has a first band gap, wherein a composed material of the second acquisition layer has a second band gap, and wherein the second band gap is smaller than the first band gap.

4. An apparatus, comprising a display device and the image sensing device according to claim 1, wherein the display device comprises the first display area which allows a light ray to pass through; and wherein the image sensing device is located under the first display area, and is configured to receive the first light signal and the second light signal through the first display area and to generate the target image according to the first light signal and the second light signal.

5. The apparatus according to claim 4, wherein the first display area comprises a plurality of pixels, and wherein the image sensing device is configured to receive the first light signal and the second light signal through a gap between the plurality of pixels.

6. The apparatus according to claim 4, wherein the image processing circuit comprises:
a first processor, connected with the reference layer and the first acquisition layer, and configured to generate a first image according to the first image signal, and the first processor being further connected with the second acquisition layer, and configured to generate a second image according to the second image signal, and
a second processor, configured to combine the first image and the second image into the target image.

7. The apparatus according to claim 4, wherein a composed material of the first acquisition layer has a first band gap, wherein a composed material of the second acquisition layer has a second band gap, and wherein the second band gap is smaller than the first band gap.

8. An image sensing method, performed by an image sensing device, comprising:
when the image sensing device is located under a first display area of a display device, enabling, on the image sensing device, a first acquisition layer to, when detecting a first light signal in a first wavelength range through the first display area, interact with a reference layer, to which a first electric signal is applied, to generate a first image signal, wherein the image sensing device comprises:
an image processing circuit, connected with an image acquisition circuit and configured to generate a target image according to the first image signal and a second image signal; and
the image acquisition circuit comprising a plurality of image acquisition layer arrays, wherein at least one of the plurality of image acquisition layer arrays comprises a reference layer, a first acquisition layer, and a second acquisition layer arranged successively,
wherein the first acquisition layer is located under the reference layer, and the image sensing device is located under the first display area of the display device, the first acquisition layer is configured to, when detecting the first light signal in the first wavelength range through the first display area, interact with the reference layer, to which the first electric signal is applied, to generate the first image signal, and
wherein the second acquisition layer is located under the first acquisition layer, and the image sensing device is located under the first display area of the display device, the second acquisition layer is configured to, when detecting a second light signal in a second wavelength range through the first display area, interact with the first acquisition layer to generate the second image signal, wherein the second wavelength range is not overlapped with the first wavelength range, wherein the second light signal is an ambient infrared light signal;

emitting a third light signal, wherein a wavelength of the third light signal is equal to a wavelength of the second light signal, and the third light signal acts on a target object to generate a first reflective light signal;
enabling the second acquisition layer to, when detecting the first reflective light signal and the second light signal in the second wavelength range, interact with the first acquisition layer to generate the second image signal, wherein the second wavelength range is not overlapped with the first wavelength range; and
generating the target image according to the first image signal and the second image signal,
wherein the first wavelength range comprises a range of 380 nm to 700 nm, and wherein the second wavelength range comprises a range of 760 nm to 1 μm;
wherein the first display area comprises a plurality of pixels, and wherein the at least one of the plurality of image acquisition layer arrays is located at a gap between at least two of the plurality of pixels, wherein a size of the at least one of the plurality of image acquisition layer arrays is smaller than or equal to a size of the gap between the at least two of the plurality of pixels, to enable the first light signal and the second light signal to pass through the gap between the at least two of the plurality of pixels and to be detected by the first acquisition layer and a second acquisition layer.

9. An image sensing device, comprising:
one or more processors; and
a non-transitory computer readable storage medium configured to store instructions executable by the one or more processors;
wherein the one or more processors are configured to:
when the image sensing device is located under a first display area of a display device, enable a first acquisition layer to, when detecting a first light signal in a first wavelength range through the first display area, interact with a reference layer, to which a first electric signal is applied, to generate a first image signal;
emit a third light signal, wherein a wavelength of the third light signal is equal to a wavelength of a second light signal, and the third light signal acts on a target object to generate a first reflective light signal;
when the image sensing device is located under the first display area of the display device, enable a second acquisition layer to, when detecting the first reflective light signal and the second light signal in a second wavelength range through the first display area, interact with the first acquisition layer to generate a second image signal, wherein the second wavelength range is not overlapped with the first wavelength range, wherein the second light signal is an ambient infrared light signal; and
generate a target image according to the first image signal and the second image signal,
wherein the first wavelength range comprises a range of 380 nm to 700 nm, and wherein the second wavelength range comprises a range of 760 nm to 1 μm;
wherein the first display area comprises a plurality of pixels, and wherein the at least one of the plurality of image acquisition layer arrays is located at a gap between at least two of the plurality of pixels, wherein a size of the at least one of the plurality of image acquisition layer arrays is smaller than or equal to a size of the gap between the at least two of the plurality of pixels, to enable the first light signal and the second light signal to pass through the gap between the at least two of the plurality of pixels and to be detected by the first acquisition layer and a second acquisition layer.

10. A non-transitory computer-readable storage medium, wherein instructions are stored in the storage medium, when executed by a one or more processors of a computing device, enable the computing device to perform acts comprising:

when an image sensing device is located under a first display area of a display device, enabling, on the image sensing device, a first acquisition layer to, when detecting a first light signal in a first wavelength range through the first display area, interact with a reference layer, to which a first electric signal is applied, to generate a first image signal, wherein the image sensing device comprises:

an image processing circuit, connected with an image acquisition circuit and configured to generate a target image according to the first image signal and a second image signal; and the image acquisition circuit comprising a plurality of image acquisition layer arrays, wherein at least one of the plurality of image acquisition layer arrays comprises a reference layer, a first acquisition layer, and a second acquisition layer arranged successively, wherein the first acquisition layer is located under the reference layer, and the image sensing device is located under the first display area of the display device, the first acquisition layer is configured to, when detecting the first light signal in the first wavelength range through the first display area, interact with the reference layer, to which the first electric signal is applied, to generate the first image signal, and wherein the second acquisition layer is located under the first acquisition layer, and the image sensing device is located under the first display area of the display device, the second acquisition layer is configured to, when detecting a second light signal in a second wavelength range through the first display area, interact with the first acquisition layer to generate the second image signal, wherein the second wavelength range is not overlapped with the first wavelength range, wherein the second light signal is an ambient infrared light signal;

emitting a third light signal, wherein a wavelength of the third light signal is equal to a wavelength of the second light signal, and the third light signal acts on a target object to generate a first reflective light signal;

enabling the second acquisition layer to, when detecting the first reflective light signal and the second light signal in the second wavelength range, interact with the first acquisition layer to generate the second image signal, wherein the second wavelength range is not overlapped with the first wavelength range; and generating the target image according to the first image signal and the second image signal, wherein the first wavelength range comprises a range of 380 nm to 700 nm, and wherein the second wavelength range comprises a range of 760 nm to 1 μm;

wherein the first display area comprises a plurality of pixels, and wherein the at least one of the plurality of image acquisition layer arrays is located at a gap between at least two of the plurality of pixels, wherein a size of the at least one of the plurality of image acquisition layer arrays is smaller than or equal to a size of the gap between the at least two of the plurality of pixels, to enable the first light signal and the second light signal to pass through the gap between the at least two of the plurality of pixels and to be detected by the first acquisition layer and a second acquisition layer.

* * * * *